(12) United States Patent
Sun et al.

(10) Patent No.: US 12,120,862 B2
(45) Date of Patent: Oct. 15, 2024

(54) SEMICONDUCTOR STRUCTURE AND METHOD FOR FORMING SEMICONDUCTOR STRUCTURE

(71) Applicant: CHANGXIN MEMORY TECHNOLOGIES, INC., Hefei (CN)

(72) Inventors: Jinping Sun, Hefei (CN); Liang Zhao, Hefei (CN); Wenfeng Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 534 days.

(21) Appl. No.: 17/470,908

(22) Filed: Sep. 9, 2021

(65) Prior Publication Data

US 2022/0139915 A1  May 5, 2022

Related U.S. Application Data

(63) Continuation of application No. PCT/CN2021/104356, filed on Jul. 2, 2021.

(30) Foreign Application Priority Data

Nov. 2, 2020 (CN) .......................... 202011201365.2

(51) Int. Cl.
*H10B 12/00* (2023.01)
(52) U.S. Cl.
CPC ............. *H10B 12/03* (2023.02); *H10B 12/30* (2023.02)

(58) Field of Classification Search
CPC ...... H10B 12/03; H10B 12/30; H10B 12/033; H10B 12/09; H01L 28/90
See application file for complete search history.

(56) References Cited

U.S. PATENT DOCUMENTS

| | | | |
|---|---|---|---|
| 8,119,476 B2 | 2/2012 | Kang | |
| 8,766,343 B2 | 7/2014 | Kang | |
| 2010/0190315 A1 | 7/2010 | Shin | |
| 2011/0159660 A1 | 6/2011 | Kang | |
| 2012/0112317 A1 | 5/2012 | Kang | |

(Continued)

FOREIGN PATENT DOCUMENTS

| | | | |
|---|---|---|---|
| CN | 102117698 A | 7/2011 | |
| CN | 108336068 A | 7/2018 | |
| CN | 109716521 A * | 5/2019 | ........ H01L 27/11524 |

(Continued)

*Primary Examiner* — Sitaramarao S Yechuri
(74) *Attorney, Agent, or Firm* — Kilpatrick Townsend & Stockton LLP

(57) ABSTRACT

The method includes: providing a substrate, the substrate including a first region and a second region; forming an insulating layer on the substrate; etching a portion of the insulating layer in the second region, the insulating layer in the first region being configured as a first insulating layer, a remaining portion of the insulating layer in the second region being configured as a second insulating layer; forming a first barrier layer covering the first insulating layer and a second barrier layer covering the second insulating layer; etching the first barrier layer, a portion of the second barrier layer and the first insulating layer to form a through hole in the first insulating layer, and to form a hole segment in the second barrier layer; and removing the first barrier layer and the second barrier layer.

19 Claims, 12 Drawing Sheets

(56) References Cited

U.S. PATENT DOCUMENTS

2013/0154055 A1* 6/2013 Park .............. H10B 43/40
                                                  257/532
2018/0330948 A1* 11/2018 Kwon ............. H10B 43/10

FOREIGN PATENT DOCUMENTS

| CN | 110970403 A | 4/2020 |
| CN | 110970460 A | 4/2020 |

* cited by examiner

SEMICONDUCTOR STRUCTURE AND METHOD FOR FORMING SEMICONDUCTOR STRUCTURE

CROSS-REFERENCE TO RELATED APPLICATIONS

This is a continuation application of International Patent Application No. PCT/CN2021/104356, filed on Jul. 2, 2021, which claims priority to Chinese Patent Application No. 202011201365.2, filed on Nov. 2, 2020 and entitled "SEMICONDUCTOR STRUCTURE AND METHOD FOR FORMING SEMICONDUCTOR STRUCTURE". The disclosures of International Patent Application No. PCT/CN2021/104356 and Chinese Patent Application No. 202011201365.2 are incorporated by reference herein in their entireties.

TECHNICAL FIELD

The disclosure relates to the technical field of semiconductors, and in particular to a semiconductor structure and a method for forming the semiconductor structure.

BACKGROUND

Due to the advantages such as the small size, the high degree of integration and the fast transmission speed, a Dynamic Random Access Memory (DRAM) is widely used in mobile devices, such as mobile phones and tablet computers. A capacitor, as a core component of the DRAM, is mainly used for storing charges.

Generally, in the manufacturing process of the capacitor, due to the limitation of the etching process, during the formation of the holes in the capacitor structure at the edge region of the semiconductor substrate, since the film layer is not be etched to an extent that the substrate is exposed, after a capacitive material is deposited in the holes subsequently, the capacitive material is peeled, thereby forming defects, which affects the yield of the semiconductor structure.

It should be noted that the above information disclosed in the Background section is merely for enhancement of understanding of the background of the disclosure, and therefore it may contain information that does not constitute the related art that is already known to a person of ordinary skill in the art.

SUMMARY

The disclosure provides a semiconductor structure and a method for forming the semiconductor structure.

According to one aspect of the disclosure, a method for forming a semiconductor structure is provided, which includes the following operations.

A substrate is provided, in which the substrate includes a first region and a second region.

An insulating layer is formed on the substrate, in which the insulating layer covers the first region and the second region.

A portion of the insulating layer in the second region is etched, in which the insulating layer in the first region is configured as a first insulating layer, a remaining portion of the insulating layer in the second region is configured as a second insulating layer, and a surface on a side of the second insulating layer away from the substrate is lower than a surface on a side of the first insulating layer away from the substrate.

A barrier layer covering the first insulating layer and a barrier layer covering the second insulating layer are formed, in which the barrier layer on the first insulating layer is configured as a first barrier layer, the barrier layer on the second insulating layer is configured as a second barrier layer, and a thickness of the second barrier layer is greater than a thickness of the first barrier layer.

A portion of the first barrier layer, a portion of the second barrier layer and a portion of the first insulating layer are etched, so as to form a through hole, which exposes the substrate, in the first insulating layer, and to form a hole segment, which does not expose the second insulating layer, in the second barrier layer.

The first barrier layer and the second barrier layer are removed.

According to one aspect of the disclosure, a semiconductor structure is provided, which includes:

a substrate including a first region and a second region;
an insulating layer formed on the substrate and including a first insulating layer and a second insulating layer, in which the first insulating layer covers the first region, the second insulating layer covers the second region, a surface on a side of the second insulating layer away from the substrate is lower than a surface on a side of the first insulating layer away from the substrate, and a through hole, which exposes the substrate, is formed in the first insulating layer.

It should be understood that the foregoing general description and the detailed description below are merely exemplary and explanatory, and do not limit the disclosure.

BRIEF DESCRIPTION OF THE DRAWINGS

The accompanying drawings herein are incorporated in and constitute a part of this specification, illustrate embodiments conforming to the disclosure, and, together with the description, serve to explain the principles of the disclosure. Apparently, the accompanying drawings in the following description show merely some embodiments of the disclosure, and persons of ordinary skill in the art may still derive other accompanying drawings from these accompanying drawings without creative efforts.

DETAILED DESCRIPTION

Figure 1:
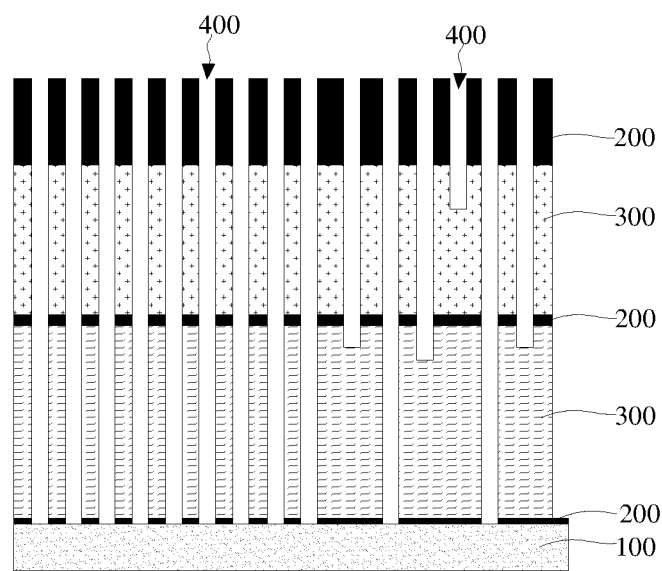
FIG. 1 is a schematic diagram of a semiconductor structure in the related art.

The exemplary embodiments will now be described more comprehensively with reference to the accompanying drawings. However, the exemplary embodiments can be implemented in various forms and should not be construed as being limited to the embodiments set forth herein. Rather, there embodiments are provided so that the disclosure will be thorough and complete, and the concepts of the exemplary embodiments will be conveyed fully to those skilled in the art. Same reference numerals in the drawings indicate the same or similar structures, and therefore their detailed description will be omitted Although relative terms such as "above" and "below" are used in the specification to describe a relative relationship of one component to another component shown, these terms are only for convenience in this specification, for example, according to an exemplary direction illustrated in the accompanying drawings. It will be appreciated that if the device shown is flipped upside down, the component described "above" will become the component "below". When a structure is "on" another structure, it may mean that a structure is integrally formed on another structure, or that a structure is "directly" disposed on another structure, or that a structure is "indirectly" disposed on another structure through the other structures.

The terms "a", "an", "the", and "said" are used to indicate that there are one or more elements/components/etc. The terms "include" and "have" are used to indicate an open meaning of including, and means that there may be additional elements/components/etc., in addition to the listed elements/components/etc. The terms "first" and "second", etc. are used only as labels and are intended to limit the number of objects.

In the related art, as shown in FIG. 1, in the manufacturing process of the capacitor, support layers 200 and mask layers 300 are required to be alternately arranged on a substrate 100. The support layers 200 and the mask layers 300 are etched to form a porous structure 400 configured to receive the capacitor. After the capacitor is formed, the mask layers 300 are removed. However, due to the limitation of the etching process, an edge region of the substrate is insufficiently etched, so that it is difficult to form a through hole which exposes the substrate. As a result, when a capacitive material is deposited subsequently, the peeling phenomenon may occur, thereby affecting the yield of the semiconductor device.

Figure 2:
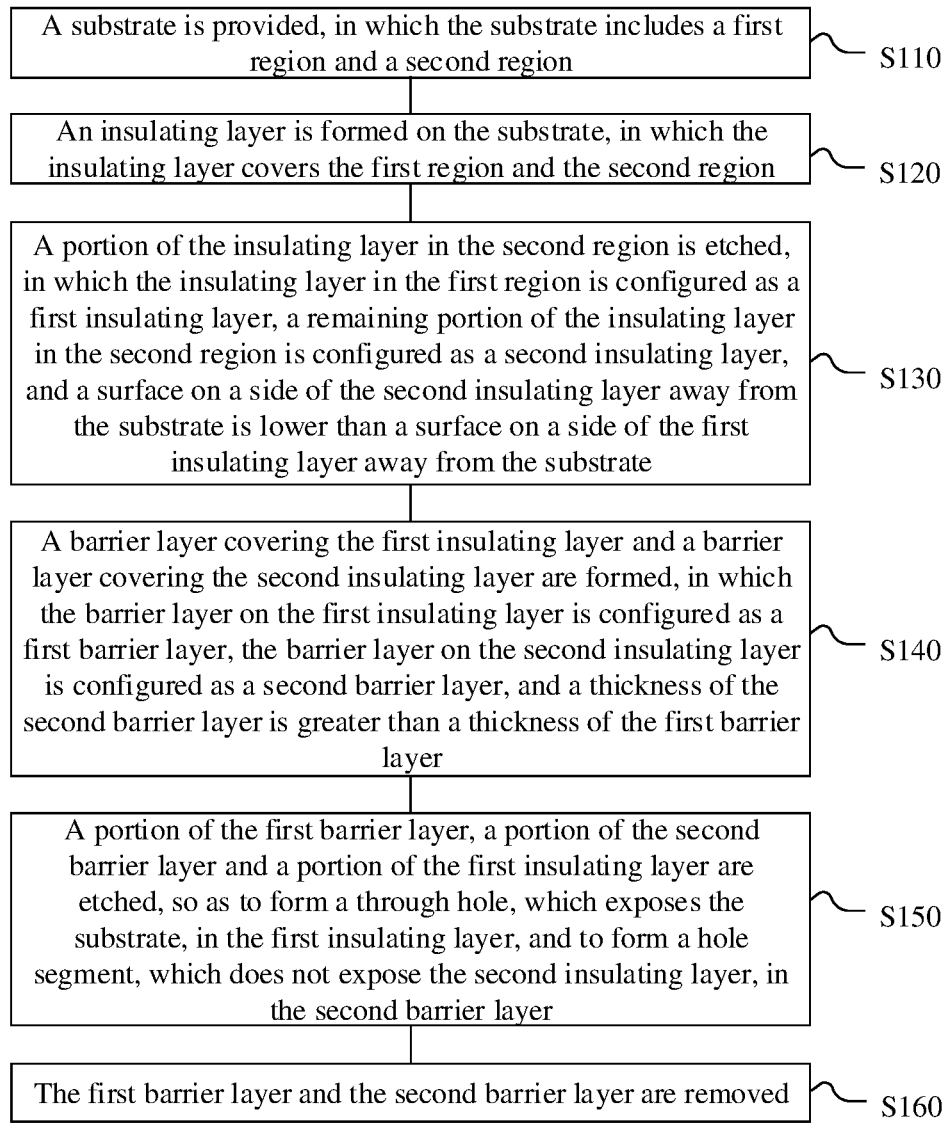
FIG. 2 is a flowchart of a method for forming a semiconductor structure according to an embodiment of the disclosure.

An embodiment of the disclosure provides a method for forming a semiconductor structure. As shown in FIG. 2, the method may include the following operations.

In S110, a substrate is provided. The substrate includes a first region and a second region.

In S120, an insulating layer is formed on the substrate. The insulating layer covers the first region and the second region.

In S130, a portion of the insulating layer in the second region is etched. The insulating layer in the first region is configured as a first insulating layer, and a remaining portion of the insulating layer in the second region is configured as a second insulating layer. A surface on a side of the second insulating layer away from the substrate is lower than a surface on a side of the first insulating layer away from the substrate.

In S140, a barrier layer covering the first insulating layer and a barrier layer covering the second insulating layer are formed. The barrier layer on the first insulating layer is configured as a first barrier layer, and the barrier layer on the second insulating layer is configured as a second barrier layer. A thickness of the second barrier layer is greater than a thickness of the first barrier layer.

In S150, a portion of the first barrier layer, a portion of the second barrier layer and a portion of the first insulating layer are etched, so as to form a through hole, which exposes the substrate, in the first insulating layer, and to form a hole segment, which does not expose the second insulating layer, in the second barrier layer.

In S160, the first barrier layer and the second barrier layer are removed.

According to the method for forming the semiconductor structure of the disclosure, during a process of simultaneously etching the first barrier layer and the second barrier layer, since the thickness of the first barrier layer is smaller, the first barrier layer is firstly etched to an extent that the first insulating layer below is exposed, so that a through hole, which exposes the first insulating layer, is formed in the first barrier layer. In this case, since the thickness of the second barrier layer is greater, the second barrier layer is not etched to an extent that the second insulating layer below is exposed, so that a hole segment, which does not expose the second insulating layer, is formed in the second barrier layer. In this case, a portion of the first insulating layer may be etched by using the first barrier layer having the through hole as a mask, so that the through hole, which exposes the substrate, is formed in the first insulating layer, while the second insulating layer is protected by the second barrier layer from being etched. Finally, after the first barrier layer and the second barrier are removed, the second insulating layer is of a structure without any holes, so that it can be ensured that when the capacitive material is subsequently deposited, the peeling phenomenon will not occur on the surface of the second insulating layer, so that defects are prevented from forming, thereby improving the yield of the semiconductor structure.

Hereinafter, various operations of the method for forming the semiconductor structure of an embodiment of the disclosure are described in detail.

As shown in FIG. 2, in S110, a substrate is provided. The substrate includes a first region and a second region.

The substrate may have a flat structure, which may be in a rectangular, circular, oval, polygonal or irregular shape, and the material of the substrate may be silicon or other semiconductor materials. The shape and material of the substrate are not specifically limited herein.

Multiple capacitor plug structures, bit line structures, transistors structures and the like, which are spaced apart from each other, may be formed in the substrate, which is not listed herein.

Figure 3:
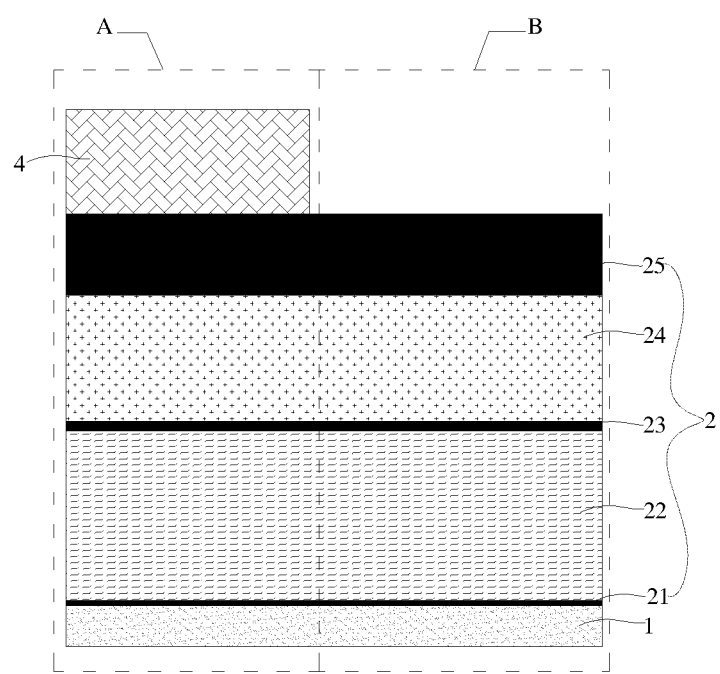
FIG. 3 is a schematic diagram of a substrate according to an embodiment of the disclosure.

As shown in FIG. 3, the substrate 1 may include a first region A and a second region B. The first region A may be arranged adjacent to the second region B. Moreover, the second region B may be arranged around the periphery of the first region A. For example, the first region A may be a circular region, a rectangular region or an irregular region. Apparently, the first region A may also be a region in other shapes, which is not specifically limited herein. The second region B may be an annular region, and may be arranged around the periphery of the first region A. The second region B may also be a circular ring-shaped region, a rectangular ring-shaped region or an annular region in other shapes, which is not listed herein.

In an embodiment, the first region A may be a central region of the substrate 1, and the second region B may be an edge region of the substrate 1. The edge region is a region arranged at a distance from a center point of the substrate 1 greater than or equal to a set value, and the central region is a region arranged at a distance from the center point of the substrate 1 less than the set value.

For example, in the case that the substrate 1 may be a circular substrate, the first region A may be a region formed by multiple points arranged at a distance from the center point of the circular substrate 1 less than 98% of the radius of the circular substrate 1, and the second region B may be a region formed by multiple points arranged at a distance from the center point of the circular substrate 1 greater than or equal to 98% of the radius of the circular substrate 1.

As shown in FIG. 2, in S120, an insulating layer is formed on the substrate. The insulating layer covers the first region and the second region.

As shown in FIG. 3, the insulating layer 2 may be formed on the substrate 1. The insulating layer 2 may include a single layer of film layer, and may also include multiple layers of film layers, which is not specifically limited herein. In an embodiment, the insulating layer 2 may include multiple layers of film layers. For example, the insulating layer 2 may include support layers and mask layers which are alternately arranged on one another.

In this embodiment, a first support layer 21, a first mask layer 22, a second support layer 23, a second mask layer 24 and a third support layer 25 may be sequentially formed on the substrate 1 through a process such as vacuum evaporation, magnetron sputtering, chemical vapor deposition, physical vapor deposition, atomic layer deposition or the like.

It should be noted that the first support layer 21, the first mask layer 22, the second support layer 23, the second mask layer 24 and the third support layer 25 may cover the first region A and the second region B. That is, orthographic projections of the first support layer 21, the first mask layer 22, the second support layer 23, the second mask layer 24 and the third support layer 25 on the substrate 1 may cover the first region A and the second region B.

The first support layer 21 may be a thin film formed on the surface of the substrate 1, and the material of the first support layer 21 may be silicon nitride. The first mask layer 22 may be formed on a side of the first support layer 21 away from the substrate 1, and the material of the first mask layer 22 may be SiO$_2$ doped with boron and phosphorus elements. The second support layer 23 may be a thin film formed on a side of the first mask layer 22 away from the substrate 1, and the material of the second support layer 23 may be the same as the material of the first support layer 21. For example, the material of the second support layer 23 may be silicon nitride. The second mask layer 24 may be formed on a side of the second support layer 23 away from the substrate 1, and may be made of an insulating material. In an embodiment, the material of the second mask layer 24 may be the same as the material of the first mask layer 22. The third support layer 25 may be formed on a side of the second mask layer 24 away from the substrate 1, and the material of the third support layer 25 may be the same as the material of the second support layer 23, or may be different from the material of the second support layer 23, which is not specifically limited herein.

As shown in FIG. 2, in S130, a portion of the insulating layer in the second region is etched, so that the insulating layer in the first region is configured as the first insulating layer, and the remaining portion of the insulating layer in the second region is configured as the second insulating layer. The surface on the side of the second insulating layer away from the substrate is lower than the surface on the side of the first insulating layer away from the substrate.

Figure 4:
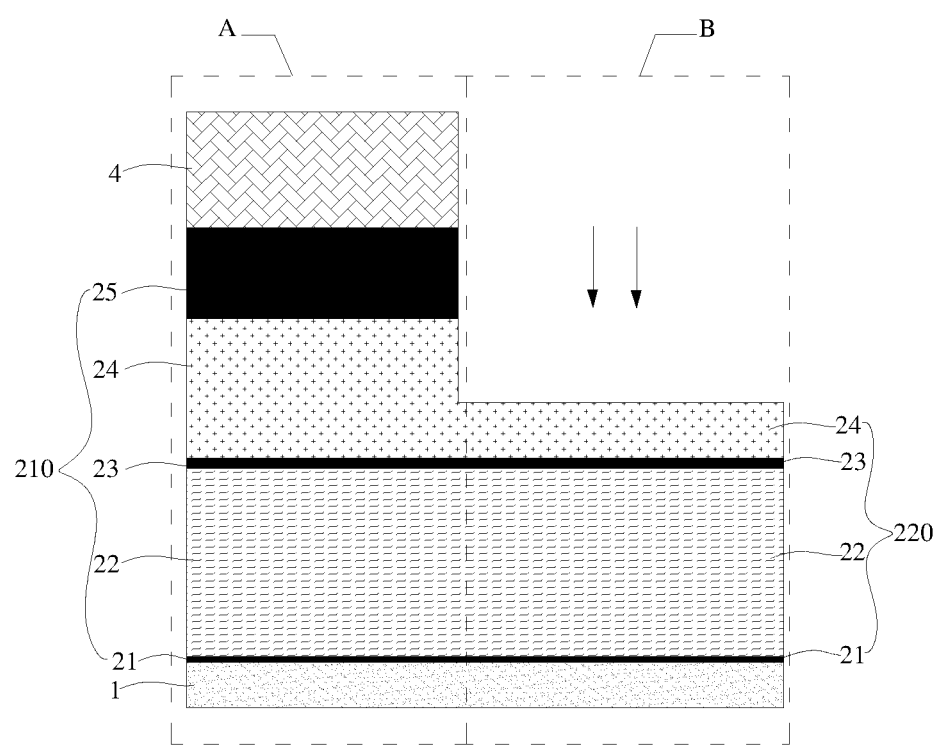
FIG. 4 is a schematic diagram showing a structure after the operation S130 in FIG. 2.

As shown in FIG. 4, a portion of the film layers of the insulating layer 2 in the second region B is etched through a photoetching process along a direction shown by an arrow in the figure, so that a thickness difference is formed between the insulating layer 2 in the second region B and the insulating layer 2 in the first region A. After the etching process is completed, in order to distinguish the insulating layer 2 covering the first region A from the insulating layer 2 covering the second region B, the insulating layer 2 in the first region A may be defined as a first insulating layer 210, and the remaining portion of the insulating layer 2 in the second region B may be defined as a second insulating layer 220. In this case, a surface on a side of the second insulating layer 220 away from the substrate 1 may be lower than a surface on a side of the first insulating layer 210 away from the substrate 1.

In this embodiment, the operation S130, in which the portion of the insulating layer 2 in the second region B is etched, so that the insulating layer 2 in the first region A is configured as the first insulating layer 210, the remaining portion of the insulating layer 2 in the second region B is configured as a second insulating layer 220, and the surface on the side of the second insulating layer 220 away from the substrate 1 is lower than the surface on the side of the first insulating layer 210 away from the substrate 1, may include the following operations. The third support layer 25 and a portion of the second mask layer 24 in the second region B are etched. After the third support layer 25 and the portion of the second mask layer 24 in the second region B are etched, the first support layer 21, the first mask layer 22, the second support layer 23 and the remaining portion of the second mask layer 24 in the second region B may be configured as the second insulating layer 220.

Figure 5:
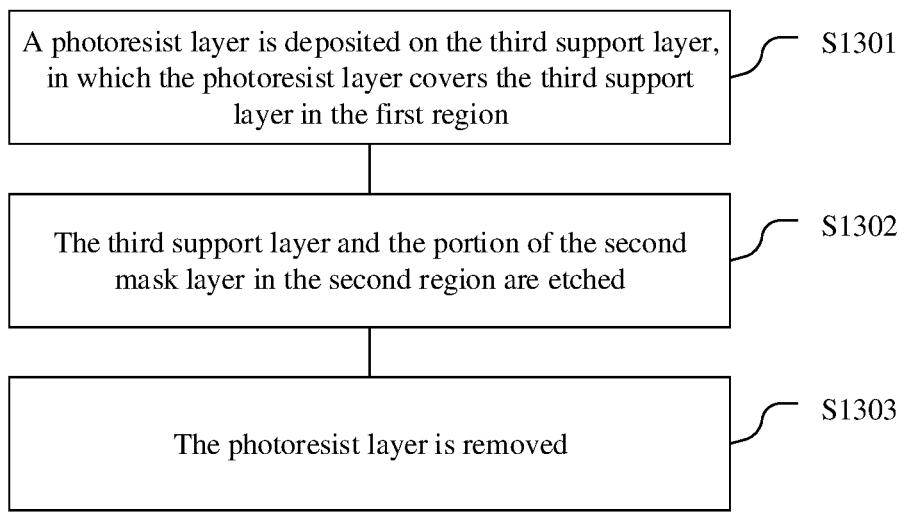
FIG. 5 is a flowchart of the operation S130 in FIG. 2.

In an embodiment, as shown in FIG. 5, the operation that the third support layer 25 and the portion of the second mask layer 24 in the second region B are etched may include the following operation.

In S1301, a photoresist layer is deposited on the third support layer. The photoresist layer covers the third support layer in the first region.

As shown in FIG. 3, the photoresist layer 4 may be formed on a surface of the third support layer 25 away from the substrate 1 through the chemical vapor deposition process, the physical vapor deposition process, the atomic layer deposition process, the spin coating process or the like. The material of the photoresist layer 4 may be a positive photoresist or a negative photoresist, which is not specifically limited herein. The photoresist layer 4 may be exposed to form a development region. The development region may expose the third support layer 25 in the second region B. The remaining portion of the photoresist layer 4 may cover a side of the third support layer 25 in the first region A away from the substrate 1, so as to prevent damage to the insulating layer 2 in the first region A during a process of etching the insulating layer 2 in the second region B.

In S1302, the third support layer and the portion of the second mask layer in the second region are etched.

As shown in FIG. 4, the third support layer 25 and the portion of the second mask layer 24 in the second region B are etched in the development region through a plasma etching process, so as to remove the third support layer 25 and the portion of the second mask layer 24 in the second region B, thereby forming a height difference between the first insulating layer 210 and the second insulating layer 220. It should be noted that the third support layer 25 and the portion of the second mask layer 24 in the second region B may be simultaneously etched by performing the etching process once. The third support layer 25 and the second mask layer 24 in the second region B may also be independently etched. That is, the third support layer 25 may be etched through the first etching process, and the second mask layer 24 may be etched through the second etching process.

In S1303, the photoresist layer is removed.

After the above etching process is completed, the photoresist layer 4 may be removed by cleaning with a cleaning solution or through an ashing process, so that the first insulating layer 210 and the second insulating layer 220 are no longer covered by the photoresist layer 4.

As shown in FIG. 2, in S140, a barrier layer covering the first insulating layer and a barrier layer covering the second insulating layer are formed. The barrier layer on the first insulating layer is configured as a first barrier layer, and the barrier layer on the second insulating layer is configured as a second barrier layer. A thickness of the second barrier layer is greater than a thickness of the first barrier layer.

Figure 6:
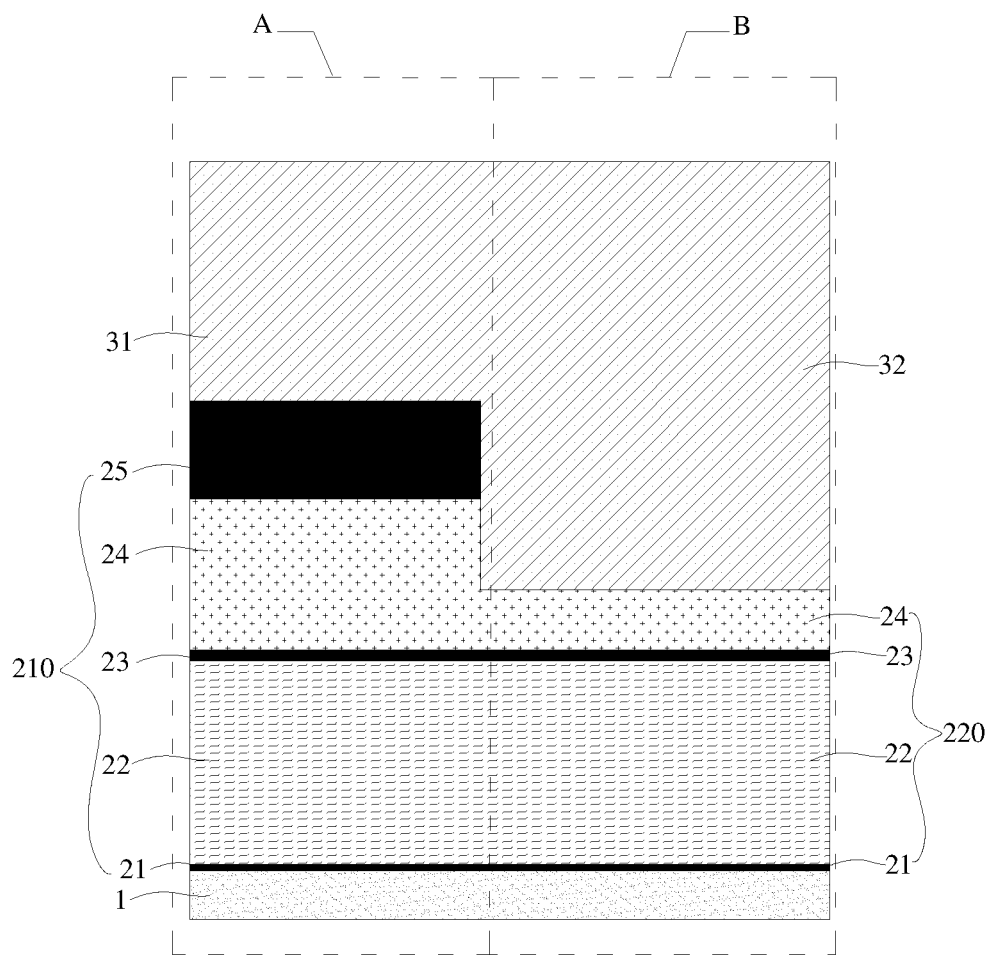
FIG. 6 is a schematic diagram showing a structure after the operation S140 in FIG. 2.

As shown in FIG. 6, the barrier layer may be formed on a side of the first insulating layer 210 away from the substrate 1 and on a side of the second insulating layer 220 away from the substrate 1. The barrier layer may be a thin film formed on a surface of each of the first insulating layer 210 and the second insulating layer 220, or may be a coating formed on a surface of each of the first insulating layer 210 and the second insulating layer 220, which is not specifically limited herein. The barrier layer may simultaneously cover the first region A and the second region B. For example, the barrier layer may be formed on the side of the insulating layer 2 away from the substrate 1 through the process such as vacuum evaporation, magnetron sputtering, chemical vapor deposition, atomic layer deposition or the like. In order to distinguish the barrier layer covering the first insulating layer 210 from the barrier layer covering the second insulating layer 220, the barrier layer on the first insulating layer 210 may be defined as a first barrier layer 31, and the barrier layer on the second insulating layer 220 may be defined as a second barrier layer 32. In an embodiment, the surface of the barrier layer away from the substrate 1 may be a plane parallel to the substrate 1, so that the thickness of the obtained second barrier layer 32 may be greater than the thickness of the first barrier layer 31.

Figure 7:
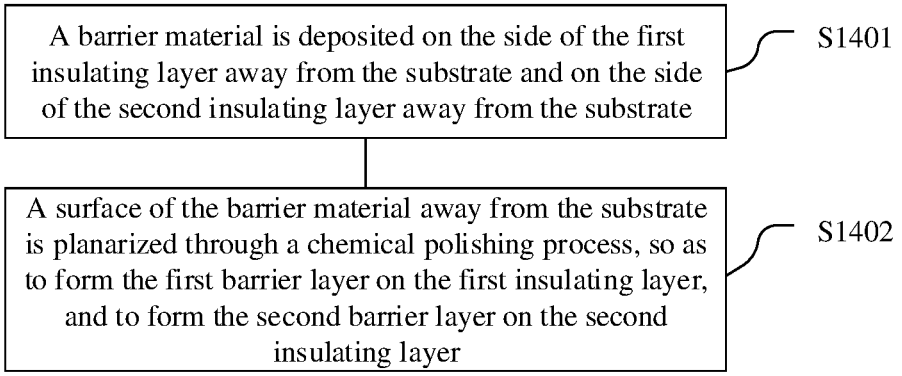
FIG. 7 is a flowchart of the operation S140 in FIG. 2.

In an embodiment of the disclosure, as shown in FIG. 7, the operation S140 may include the following operation.

In S1401, a barrier material is deposited on the side of the first insulating layer away from the substrate and on the side of the second insulating layer away from the substrate.

Figure 8:
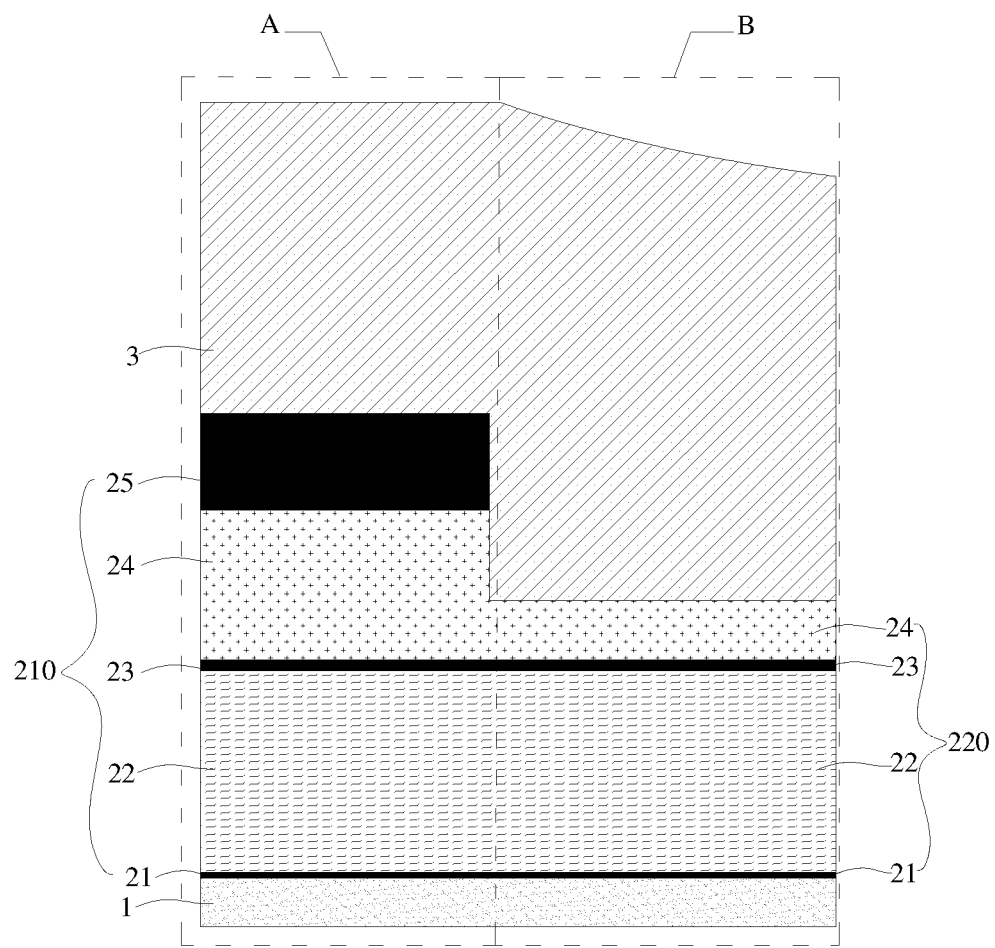
FIG. 8 is a schematic diagram showing a structure after the operation S1401 in FIG. 7.

As shown in FIG. 8, the barrier material 3 may be formed on the side of the first insulating layer 210 away from the substrate 1 and on the side of the second insulating layer 220 away from the substrate 1 through the atomic layer deposition process or the chemical vapor deposition process. The barrier material 3 may be a polymer material or other materials which can serve as a barrier layer, which is not specifically limited herein.

It should be noted that the thickness of the first insulating layer 210 is greater than the thickness of the second insulating layer 220. Thus, a height difference may be formed between the barrier material 3 formed on the surface of the first insulating layer 210 in the first region A and the barrier material 3 formed on the surface of the second insulating layer 220 in the second region B.

In S1402, a surface of the barrier material away from the substrate is planarized through a chemical polishing process, so as to form the first barrier layer on the first insulating layer, and to form the second barrier layer on the second insulating layer.

The surface of the barrier material 3 away from the substrate 1 may be planarized, so as to form the first barrier layer 31 on the first insulating layer 210, and to form the second barrier layer 32 on the second insulating layer 220. For example, the surface of the barrier material 3 may be treated through the etching process or the chemical polishing process, so that the surface of the barrier material 3 away from the substrate 1 is parallel to the substrate 1. FIG. 6 shows a structure after S140 in an embodiment of the method of the disclosure.

It should be noted that the etching selectivity ratio of the first insulating layer 210 to the second barrier layer 32 may be relatively larger, so that under the same etching condition, the etching rate of the first insulating layer 210 may be much greater than the etching rate of the second barrier layer 32. For example, the etching selectivity ratio of the first insulating layer 210 to the second barrier layer 32 may be greater than 100. Apparently, it may also be other etching selectivity ratios, as long as the etching rate of the first insulating layer 210 can be ensured to be much greater than the etching rate of the second barrier layer 32. The etching selectivity ration of the first insulating layer 210 to the second barrier layer 32 is not specifically limited herein.

As shown in FIG. 2, in S150, a portion of the first barrier layer, a portion of the second barrier layer and a portion of the first insulating layer are etched, so as to form a through hole, which exposes the substrate, in the first insulating layer, and to form a hole segment, which does not expose the second insulating layer, in the second barrier layer.

Figure 9:
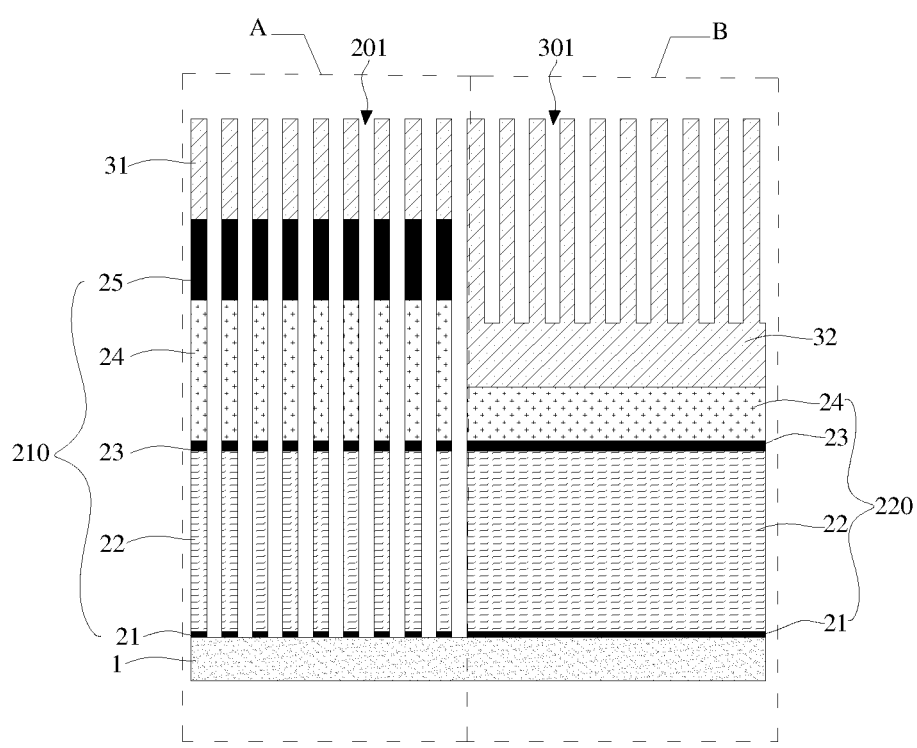
FIG. 9 is a schematic diagram showing a structure after the operation S150 in FIG. 2.

As shown in FIG. 9, the first barrier layer 31, the portion of the second barrier layer 32 and the first insulating layer 210 may be etched to form the through hole 201, in which the capacitor is deposited, in the first insulating layer 210. The through hole 201 may extend in a direction perpendicular to the substrate 1, and the shape of the cross section of the through hole 201 may be a circle shape, a rectangle shape or the like, and may also be an irregular shape. The shape of the through hole 201 is not specifically limited herein.

Figure 10:
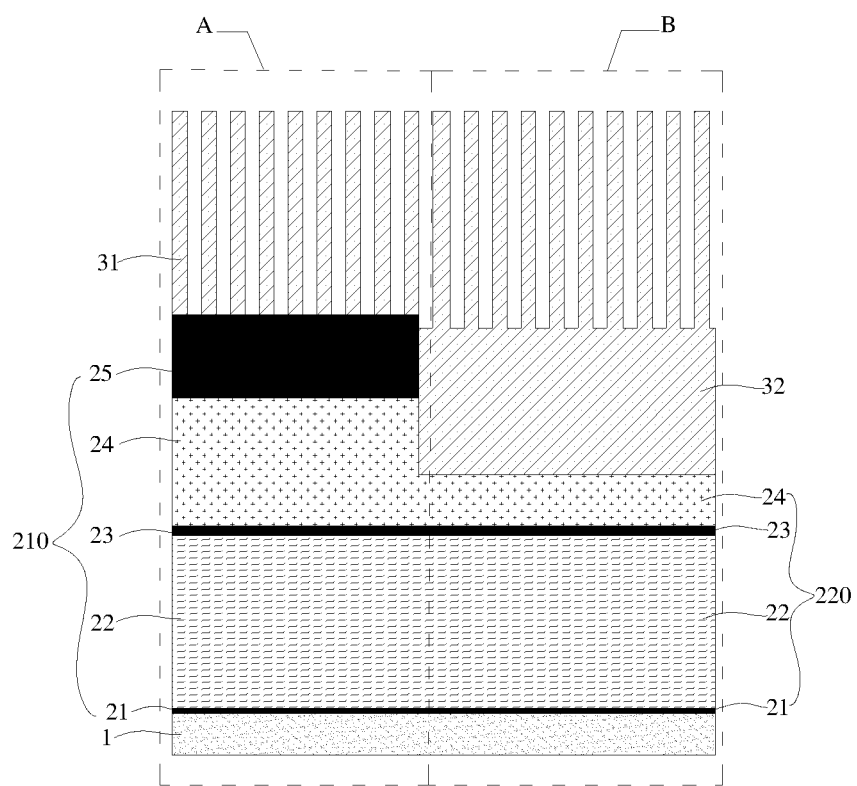
FIG. 10 is a schematic diagram of etching a portion of a first barrier layer and a portion of a second barrier layer according to an embodiment of the disclosure.

As shown in FIG. 10, during a process of simultaneously etching in the first region A and the second region B, since the thickness of the first barrier layer 31 is smaller, the first barrier layer 31 is firstly etched to an extent that the first insulating layer 210 below is exposed, so that the through hole 201, which exposes the first insulating layer 210, is formed in the first barrier layer 31. In this case, since the thickness of the second barrier layer 32 is greater, the second barrier layer 32 is not etched to an extent that the second insulating layer 220 below is exposed, so that the hole segment 301, which does not expose the second insulating layer 220, is formed in the second barrier layer 32. In this case, a portion of the first insulating layer 210 may be etched by using the first barrier layer 31 having the through hole 201 as a mask. Since the etching selectivity ratio of the first insulating layer 210 to the second barrier layer 32 is greater than 100, it can be ensured that in the process of etching the portion of the first insulating layer 210, damage to the second barrier layer 32 is small, and the second insulating layer 220 will not be etched. In addition, since the area of the second region B is much smaller than the area of the first region A, in the composition of the original semiconductor structure, a complete capacitor structure cannot be formed. The semiconductor structure and the method for forming the semiconductor structure of the disclosure will not reduce the number of the semiconductor devices.

In an embodiment, there are multiple through holes 201. The multiple through holes 201 may be arranged in an array. In this case, the first region A of the substrate 1 may include multiple capacitor plugs arranged in an array. It should be noted that the number of the through holes 201 may be equal to the number of capacitor plugs in the first region A, and each through hole 201 may expose the respective one of the capacitor plugs.

Figure 11:
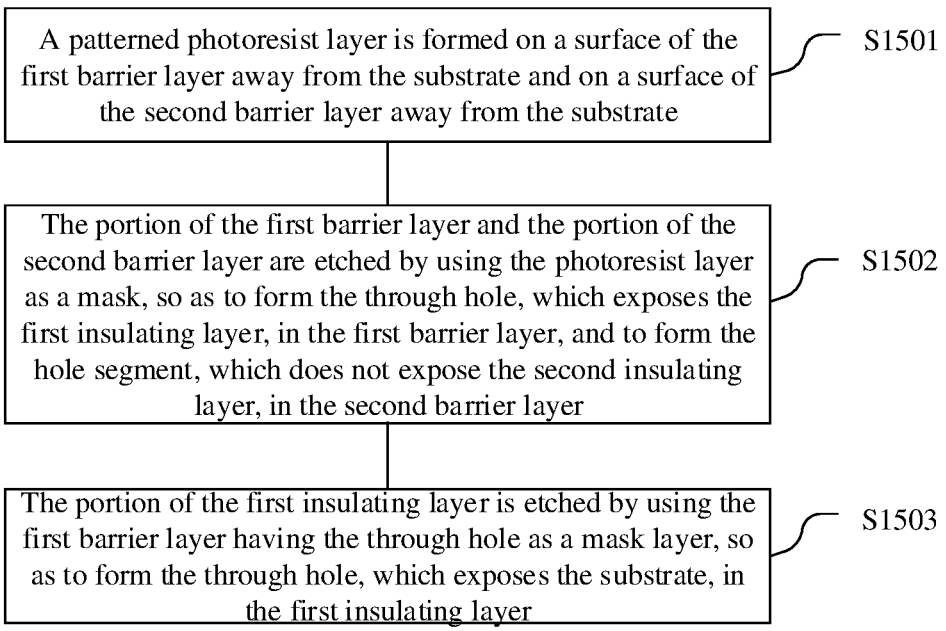
FIG. 11 is a flowchart of the operation S150 in FIG. 2.

In an embodiment of the disclosure, as shown in FIG. 11, the operation S150 may contain operations S1501 to S1503.

In S1501, a patterned photoresist layer is formed on a surface of the first barrier layer away from the substrate and on a surface of the second barrier layer away from the substrate.

The photoresist layer may be formed on the surface of the first barrier layer 31 away from the substrate 1 and on the surface of the second barrier layer 32 away from the substrate 1 through the spin coating process or other processes. The material of the photoresist layer may be a positive photoresist or a negative photoresist, which is not specifically limited herein. The photoresist layer may be exposed by using a mask to form the photoresist layer with a pattern. The pattern may match a pattern required by the first insulating layer 210.

In S1502, by using the photoresist layer as a mask, the portion of the first barrier layer and the portion of the second barrier layer are etched, so as to form the through hole, which exposes the first insulating layer, in the first barrier layer, and to form the hole segment, which does not expose the second insulating layer, in the second barrier layer.

By using the photoresist layer as a mask, the portion of the first barrier layer 31 and the portion of the second barrier layer 32 are etched through the plasma etching process, so as to form the through hole 201, which exposes the first insulating layer 210, in the first barrier layer 31, and to form the hole segment 301, which does not expose the second insulating layer 220, in the second barrier layer 32. After the above etching process is completed, the photoresist layer may be removed by cleaning with a cleaning solution or through an ashing processes, so that the first barrier layer 31 and the second barrier layer 32 are no longer covered by the photoresist layer.

In S1503, by using the first barrier layer having the through hole as a mask layer, the portion of the first insulating layer is etched, so as to form the through hole, which exposes the substrate, in the first insulating layer.

Anisotropic etching may be performed on the first insulating layer 210 by using the first barrier layer 31 having the through hole 201 as a mask layer. For example, by using the first barrier layer 31 of a structure with the through hole as a mask, the first insulating layer 210 may be etched through a dry etching process, and by using the substrate 1 as an etch stop layer, multiple through holes 201 are formed in the first insulating layer 210. During this process, the second barrier layer 32 is continuously etched. Since the etching selectivity ratio of the first insulating layer 210 to the second barrier layer 32 is relatively large, when the first insulating layer 210 is etched through, the second barrier layer 32 is still not etched through. For the second region B, the hole segment 301 is only formed in the second barrier layer 32, and the second insulating layer 220 below will not be etched. In this way, it can be ensured that when the capacitive material is deposited subsequently, the peeling phenomenon will not occur on the surface of the second insulating layer 220, so that defects are prevented from forming, thereby improving the yield of the semiconductor structure.

In S160, the first barrier layer and the second barrier layer are removed.

Figure 12:
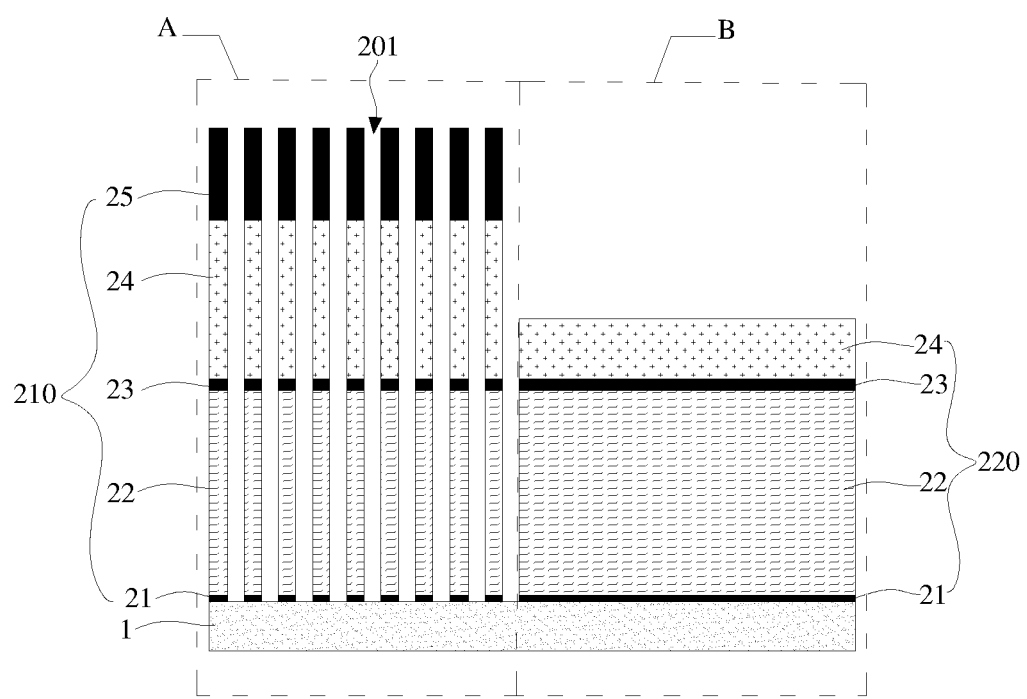
FIG. 12 is a schematic diagram showing a structure after removing a barrier layer according to an embodiment of the disclosure.

As shown in FIG. 12, after the through hole 201 is formed, the first barrier layer 31 and the second barrier layer 32 may be removed, and only the substrate 1 and the material of the etched insulating layer 2 are reserved. Subsequently, the capacitor may be formed in each through hole 201. The capacitor may in contact with the capacitor plug in the substrate 1, so that the charges collected by the capacitor can be stored through the capacitor plug.

An embodiment of the disclosure also provides a semiconductor structure. As shown in FIG. 12, the semiconductor structure may include a substrate 1 and an insulating layer.

The substrate 1 may include a first region A and a second region B.

The insulating layer may be formed on the substrate 1 and may include a first insulating layer 210 and a second insulating layer 220. The first insulating layer 210 may cover the first region A, and the second insulating layer 220 may cover the second region B. A surface on a side of the second insulating layer away from the substrate 1 may be lower than a surface on a side of the first insulating layer 210 away from the substrate 1. A through hole 201, which exposes the substrate 1, may be formed in the first insulating layer 210.

The substrate 1 may include the first region A and the second region B. The first region A may be arranged adjacent to the second region B. Moreover, the second region B may be arranged around the periphery of the first region A. For example, the first region A may be a circular region, a rectangular region or an irregular region. Apparently, the first region A may also be a region in other shapes, which is not specifically limited herein. The second region B may be an annular region, and may be arranged around the periphery of the first region A. The second region B may also be a circular ring-shaped region, a rectangular ring-shaped region or an annular region in other shapes, which is not listed herein.

In an embodiment, the first region A may be a central region of the substrate 1, and the second region B may be an edge region of the substrate 1. The edge region may be a region arranged at a distance from a center point of the substrate 1 greater than or equal to a set value, and the central region may be a region arranged at a distance from the center point of the substrate 1 less than the set value.

For example, in the case that the substrate 1 may be a circular substrate, the first region A may be a region formed by multiple points arranged at a distance from the center point of the circular substrate 1 less than 98% of the radius of the circular substrate 1, and the second region B may be a region formed by multiple points arranged at a distance from the center point of the circular substrate 1 greater than or equal to 98% of the radius of the circular substrate 1.

The insulating layer may be formed on the substrate 1. The insulating layer may include a single layer of film layer, and may also include multiple layers of film layers, which is not specifically limited herein. In an embodiment, the insulating layer may include multiple layers of film layers. For example, the insulating layer may include support layers and mask layers which are alternately arranged on one another.

The insulating layer may include a first support layer 21, a first mask layer 22, a second support layer 23, a second mask layer 24 and a third support layer 25 which are sequentially stacked on one another. The first support layer 21 may be formed on the surface of the substrate 1, and may cover the first region A and the second region B.

The first support layer 21 may be a thin film formed on the surface of the substrate 1, and the material of the first support layer 21 may be silicon nitride. The first mask layer 22 may be formed on a side of the first support layer 21 away from the substrate 1, and the material of the first mask layer 22 may be $SiO_2$ doped with boron and phosphorus elements. The second support layer 23 may be a thin film formed on a side of the first mask layer 22 away from the substrate 1, and the material of the second support layer 23 may be the same as the material of the first support layer 21. For example, the material of the second support layer 23 may be silicon nitride. The second mask layer 24 may be formed on a side of the second support layer 23 away from the substrate 1, and may be made of an insulating material. In an embodiment, the material of the second mask layer 24 may be the same as the material of the first mask layer 22. The third support layer 25 may be formed on a side of the second mask layer 24 away from the substrate 1, and the material of the third support layer 25 may be the same as the material of the second support layer 23, or may be different from the material of the second support layer 23, which is not specifically limited herein.

The first insulating layer 210 may include the first support layer 21, the first mask layer 22, the second support layer 23, the second mask layer 24 and the third support layer 25 in the first region A, and the second insulating layer 220 may include the first support layer 21, the first mask layer 22, the second support layer 23 and the second mask layer 24 in the second region B.

Specific details and forming processes of the components in the semiconductor structure are described in detail in the corresponding method for forming the semiconductor structure, which will not be repeated herein.

The semiconductor structure may be a memory chip, for example, a Dynamic Random Access Memory (DRAM). Apparently, the semiconductor structure may also be other semiconductor structures, which is not listed herein.

Other embodiments of the disclosure will be apparent to those skilled in the art from consideration of the specification and practice of the disclosure disclosed here. The disclosure is intended to cover any variations, uses, or adaptations of the disclosure following the general principles thereof and including such departures from the disclosure as come within known or customary practice in the art. It is intended that the specification and embodiments are considered as exemplary only, with a true scope and spirit of the disclosure being indicated by the following claims.

The invention claimed is:

1. A method for forming a semiconductor structure, comprising:
    providing a substrate, the substrate comprising a first region and a second region;
    forming an insulating layer on the substrate, the insulating layer covering the first region and the second region;
    etching a portion of the insulating layer in the second region, the insulating layer in the first region being configured as a first insulating layer, a remaining portion of the insulating layer in the second region being configured as a second insulating layer, and a surface on a side of the second insulating layer away from the substrate being lower than a surface on a side of the first insulating layer away from the substrate;
    forming a barrier layer covering the first insulating layer and a barrier layer covering the second insulating layer, the barrier layer on the first insulating layer being configured as a first barrier layer, the barrier layer on the second insulating layer being configured as a second barrier layer, and a thickness of the second barrier layer being greater than a thickness of the first barrier layer;
    etching a portion of the first barrier layer, a portion of the second barrier layer and a portion of the first insulating layer to form a through hole, which exposes the substrate, in the first insulating layer, and to form a hole segment, which does not expose the second insulating layer, in the second barrier layer; and
    removing the first barrier layer and the second barrier layer.

2. The method for forming the semiconductor structure of claim 1, wherein forming the insulating layer on the substrate, the insulating layer covering the first region and the second region, comprises:
    forming a first support layer on the substrate, the first support layer covering the first region and the second region;
    forming a first mask layer on a side of the first support layer away from the substrate;
    forming a second support layer on a side of the first mask layer away from the substrate;
    forming a second mask layer on a side of the second support layer away from the substrate; and
    forming a third support layer on a side of the second mask layer away from the substrate,
    wherein the first support layer, the first mask layer, the second support layer, the second mask layer and the third support layer cover the first region and the second region.

3. The method for forming the semiconductor structure of claim 2, wherein etching the portion of the insulating layer in the second region, the insulating layer in the first region being configured as the first insulating layer, the remaining portion of the insulating layer in the second region being configured as the second insulating layer, and the surface on the side of the second insulating layer away from the substrate being lower than the surface on the side of the first insulating layer away from the substrate, comprises:
    etching the third support layer and a portion of the second mask layer in the second region, wherein the first support layer, the first mask layer, the second support layer and a remaining portion of the second mask layer in the second region are configured as the second insulating layer; and
    wherein the first support layer, the first mask layer, the second support layer, the second mask layer and the third support layer in the first region are configured as the first insulating layer.

4. The method for forming the semiconductor structure of claim 3, wherein etching the third support layer and the portion of the second mask layer in the second region comprises:
    depositing a photoresist layer on the third support layer, the photoresist layer covering the third support layer in the first region;
    etching the third support layer and the portion of the second mask layer in the second region; and
    removing the photoresist layer.

5. The method for forming the semiconductor structure of claim 4, wherein an etching selectivity ratio of the first insulating layer to the second barrier layer is greater than 100.

6. The method for forming the semiconductor structure of claim 4, wherein the first region is arranged adjacent to the second region, the first region is a central region of the substrate, the second region is an edge region of the substrate, the edge region is a region arranged at a distance from a center point of the substrate greater than or equal to a set value, and the central region is a region arranged at a distance from the center point of the substrate less than the set value.

7. The method for forming the semiconductor structure of claim 3, wherein an etching selectivity ratio of the first insulating layer to the second barrier layer is greater than 100.

8. The method for forming the semiconductor structure of claim 3, wherein the first region is arranged adjacent to the second region, the first region is a central region of the substrate, the second region is an edge region of the substrate, the edge region is a region arranged at a distance from a center point of the substrate greater than or equal to a set value, and the central region is a region arranged at a distance from the center point of the substrate less than the set value.

9. The method for forming the semiconductor structure of claim 2, wherein an etching selectivity ratio of the first insulating layer to the second barrier layer is greater than 100.

10. The method for forming the semiconductor structure of claim 2, wherein the first region is arranged adjacent to the second region, the first region is a central region of the substrate, the second region is an edge region of the substrate, the edge region is a region arranged at a distance from a center point of the substrate greater than or equal to a set value, and the central region is a region arranged at a distance from the center point of the substrate less than the set value.

11. The method for forming the semiconductor structure of claim 1, wherein forming the barrier layer covering the first insulating layer and the barrier layer covering the second insulating layer, the barrier layer on the first insulating layer being configured as the first barrier layer, the barrier layer on the second insulating layer being configured as the second barrier layer, and the thickness of the second barrier layer being greater than the thickness of the first barrier layer, comprises:
　depositing a barrier material on the side of the first insulating layer away from the substrate and on the side of the second insulating layer away from the substrate; and
　planarizing a surface of the barrier material away from the substrate through a chemical polishing process to form the first barrier layer on the first insulating layer and to form the second barrier layer on the second insulating layer.

12. The method for forming the semiconductor structure of claim 11, wherein an etching selectivity ratio of the first insulating layer to the second barrier layer is greater than 100.

13. The method for forming the semiconductor structure of claim 11, wherein the first region is arranged adjacent to the second region, the first region is a central region of the substrate, the second region is an edge region of the substrate, the edge region is a region arranged at a distance from a center point of the substrate greater than or equal to a set value, and the central region is a region arranged at a distance from the center point of the substrate less than the set value.

14. The method for forming the semiconductor structure of claim 1, wherein an etching selectivity ratio of the first insulating layer to the second barrier layer is greater than 100.

15. The method for forming the semiconductor structure of claim 14, wherein etching the portion of the first barrier layer, the portion of the second barrier layer and the portion of the first insulating layer to form the through hole, which exposes the substrate, in the first insulating layer, and to form the hole segment, which does not expose the second insulating layer, in the second barrier layer, comprises:
　forming a patterned photoresist layer on a surface of the first barrier layer away from the substrate and on a surface of the second barrier layer away from the substrate;
　etching, by using the photoresist layer as a mask, the portion of the first barrier layer and the portion of the second barrier layer to form the through hole, which exposes the first insulating layer, in the first barrier layer, and to form the hole segment, which does not expose the second insulating layer, in the second barrier layer; and
　etching, by using the first barrier layer having the through hole as a mask layer, the portion of the first insulating layer to form the through hole, which exposes the substrate, in the first insulating layer.

16. The method for forming the semiconductor structure of claim 1, wherein the first region is arranged adjacent to the second region, the first region is a central region of the substrate, the second region is an edge region of the substrate, the edge region is a region arranged at a distance from a center point of the substrate greater than or equal to a set value, and the central region is a region arranged at a distance from the center point of the substrate less than the set value.

17. A semiconductor structure, comprising:
　a substrate comprising a first region and a second region;
　an insulating layer formed on the substrate and comprising a first insulating layer and a second insulating layer, the first insulating layer covering the first region, the second insulating layer covering the second region, a surface on a side of the second insulating layer away from the substrate being lower than a surface on a side of the first insulating layer away from the substrate, and a through hole, which exposes the substrate, being formed in the first insulating layer; and,
　wherein the first insulating layer comprises a first support layer, a first mask layer, a second support layer, a second mask layer and a third support layer in the first region, and the second insulating layer comprises a first support layer, a first mask layer, a second support layer and a second mask layer in the second region.

18. The semiconductor structure of claim 17, wherein the first region is arranged adjacent to the second region, the first region is a central region of the substrate, the second region is an edge region of the substrate, the edge region is a region arranged at a distance from a center point of the substrate greater than or equal to a set value, and the central region is a region arranged at a distance from the center point of the substrate less than the set value.

19. The semiconductor structure of claim 17, wherein the first region is arranged adjacent to the second region, the first region is a central region of the substrate, the second region is an edge region of the substrate, the edge region is a region arranged at a distance from a center point of the substrate greater than or equal to a set value, and the central region is a region arranged at a distance from the center point of the substrate less than the set value.

\* \* \* \* \*